(12) United States Patent
Bao et al.

(10) Patent No.: US 6,248,665 B1
(45) Date of Patent: Jun. 19, 2001

(54) DELAMINATION IMPROVEMENT BETWEEN CU AND DIELECTRICS FOR DAMASCENE PROCESS

(75) Inventors: Tien-I. Bao; Syun-Ming Jang, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/347,912

(22) Filed: Jul. 6, 1999

(51) Int. Cl.$^7$ .................................................. H01L 21/44
(52) U.S. Cl. .................. 438/687; 438/637; 438/638; 438/660; 438/666; 438/668; 438/672
(58) Field of Search ..................... 438/687, 637, 438/638, 660, 666, 668, 672

(56) References Cited

U.S. PATENT DOCUMENTS

| | | | |
|---|---|---|---|
| 4,910,169 | 3/1990 | Hoshino | 437/198 |
| 5,527,739 | 6/1996 | Parrillo et al. | 437/198 |
| 5,612,254 | 3/1997 | Mu et al. | 437/195 |
| 5,714,418 * | 2/1998 | Bai et al. | 438/687 |
| 5,731,245 | 3/1998 | Joshi et al. | 438/705 |
| 5,807,660 | 9/1998 | Lin et al. | 430/313 |
| 5,814,557 | 9/1998 | Venkatraman et al. | 438/622 |
| 6,037,664 * | 3/2000 | Zhao et al. | 257/758 |

OTHER PUBLICATIONS

Wolf, Silicon Processing For The VLSI Era, vol. 1, Lattice Press, pp. 182–195, 1986.*
Wolf, Silicon Processing For The VLSI Era, vol. 2, Lattice Press, pp. 194–199, 1990.*

* cited by examiner

Primary Examiner—John F. Niebling
Assistant Examiner—Lynne A. Gurley
(74) Attorney, Agent, or Firm—George O. Saile; Stephen B. Ackerman (57) ABSTRACT

A new method is provided to improve surface adhesion between copper surfaces and the dielectric that is deposited over these copper surfaces. The invention eliminates the formation of CuO bubbles and unstable copper surfaces. A 400 degrees C. pre-heat relaxes the copper surfaces after polishing of these surfaces. A $NH_3$ plasma treatment of the surfaces of the damascene structures removes the CuO bubbles and forms copper grain on the surfaces of the damascene structures to improve adhesion.

16 Claims, 5 Drawing Sheets

DELAMINATION IMPROVEMENT BETWEEN CU AND DIELECTRICS FOR DAMASCENE PROCESS

BACKGROUND OF THE INVENTION (1) Field of the Invention

The invention relates to the fabrication of integrated circuit devices, and more particularly, to a method to improve adhesion between copper and the overlying dielectric in the Damascene process.

(2) Description of the Prior Art

The present invention relates to the creation of copper conductive lines and vias that provide the interconnection of integrated circuits in semiconductor devices and/or the interconnections in a multilayer substrate on which semiconductor device(s) are mounted. The present invention specifically relates to the fabrication of conductive lines and vias by a process known as damascene.

The damascene process is used for a number of applications. The most commonly applied process is first metal or local interconnects. Some early damascene structures have been achieved using Reactive Ion Etching (RIE) but Chemical Mechanical Planarization (CMP) is used exclusively today. Metal interconnects using damascene of aluminum are also explored.

In fabricating very and ultra-large-scale-integration (VLSI and ULSI) circuits with the dual damascene process, an insulating or dielectric material, such as silicon oxide, of a semiconductor device is patterned with several thousand openings for the conductive lines and vias. These openings are filled at the same time with metal, such as aluminum or copper, and serve to interconnect the active and/or passive elements of the integrated circuit. The dual damascene process also is used for forming the multilevel conductive lines of metal, such as copper, in the insulating layers, such as polyimide, of multi-layer substrates on which semiconductor devices are mounted.

Damascene therefore is an interconnection fabrication process in which grooves are formed in an insulating layer and filled with metal to form the conductive lines. Dual damascene is a multi-level interconnection process in which, in-addition to forming the grooves of single damascene, conductive via openings are also formed. In the standard dual damascene process, the insulating layer is coated with a photoresist which is exposed through a first mask with an image pattern of the via openings, the pattern is anisotropically etched in the upper half of the insulating layer. The photoresist now is exposed through a second mask with an image pattern of the conductive line openings, after being aligned with the first mask pattern to encompass the via openings. In anisotropically etching the openings for the conductive lines in the upper half of the insulating material, the via openings already present in the upper half are simultaneously etched and replicated in the lower half of the insulating material. After the etching is complete,, both the vias and line openings are filled with metal. Dual damascene is an improvement over single damascene because it permits the filling of both the conductive grooves and vias with metal at the same time, thereby eliminating process steps. Although this standard damascene process offers advantages over other processes for forming interconnections, it has a number or disadvantages. It requires two masking steps to form the pattern, first for the vias and subsequently for the conductive lines. Furthermore, the edges of the via openings in the lower half of the insulating layer, after the second etching, are poorly defined because of the two etchings. In addition, since alignment of the two masks is critical in order for the pattern for the conductive lines to be over the pattern of the vias, a relatively large tolerance is provided and the vias do not extend the full width of the conductive line.

As dimensions of IC devices within advanced IC's have continued to decrease, so also have the dimensions of conductors and interconnection elements, which connect and interconnect those integrated circuit devices. First level interconnect wires have been traditionally formed using aluminum or aluminum alloys. First level metal interconnect vias have typically been formed using tungsten. In the micron and sub-micron device feature environment, it is increasingly important for conductor and interconnection elements within IC's to have a high level of conductivity while at the same time showing limited susceptibility to degradative phenomenon such as electromigration. In order to simultaneously provide the desired high level of electrical conductivity and low electromigration susceptibility of conductor and interconnection elements within advanced IC's, the use of copper is gaining wider acceptance in these applications. The use of copper and copper metal alloys in these applications is becoming more sophisticated while the effects of various processing conditions and processing applications is becoming better understood.

The application of copper in creating interconnecting lines and vias suffers from a number of disadvantages, including formation of undesirable inter-metallic alloys and/or recombination centers in other parts of the integrated circuit. and they often have low diffusion rates. Copper has the additional disadvantage of being readily oxidized at relatively low temperatures. Copper does however offer the advantage of low cost and ease of processing so that the prior and current art has tended to concentrate on finding ways to overcome these limitations. One of the most difficult problems encountered in processing copper is its susceptibility to oxidation. This severely restricts the use of conventional photoresist processing when patterning copper because the photoresist needs to be removed at the end of the process by heating it in a highly oxidized environment, such as an oxygen plasma, thereby converting it to an easily removed ash. Several solutions to the above problem associated with copper processing have been proposed in the prior art. Hoshino (U.S. Pat. No. 4,910,169, dated March 1990) teaches the use of low temperature deposition techniques such as RF sputtering, for coating copper layers with materials such as silicon oxide, silicon nitride, and phosphosilicate glass.

Copper, when used as an interconnect material, has a relatively large diffusion coefficient into silicon dioxide and silicon. Copper from an interconnect may therefore diffuse into the silicon dioxide layer causing the dielectric to be conductive and also decreasing the dielectric strength of the silicon dioxide layer. For this reason, copper interconnects require to be encapsulated by at least one diffusion barrier to prevent the indicated diffusion of the copper into the dielectric layer. Silicon nitride can be used for this diffusion layer. Because silicon nitride has a high dielectric constant compared with silicon dioxide, this diffusion layer increases the capacitance between the interconnect and the substrate thereby having a negative effect on device performance.

In the damascene process, good adhesion between the copper interconnects and the surrounding dielectric is required to avoid copper delamination. However, copper CMP is a destructive process to both the copper and the dielectric interface. Successive deposition of dielectric layers results in the formation of unstable copper surface and the creation of CuO residues resulting in the occurrence of surface bubbles and copper to dielectric delamination. The invention addresses these problems by providing a method of treating the copper surface and to remove the CuO from the surface of the copper to dielectric interface.

Figure 1A:
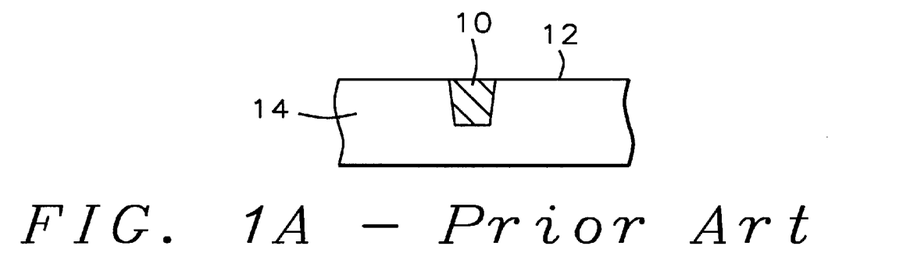
FIGS. 1a through 1e show the Prior Art process of forming a damascene structure.

FIG. 1 gives an overview of the Prior Art Damascene process, as follows:

FIG. 1a shows the metal plug formed after the surface planarization.

Figure 1B:
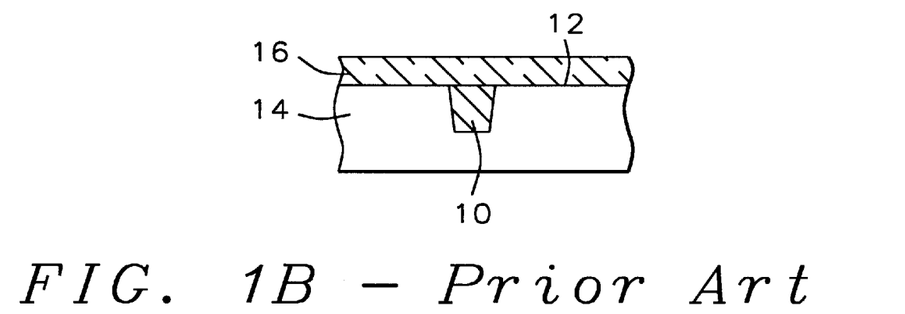

FIG. 1b shows the deposition of the Intra Level Dielectric.

Figure 1C:
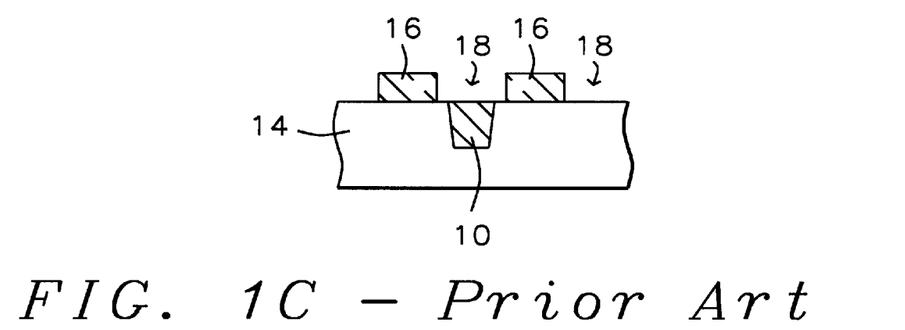

FIG. 1c shows the formation of the trenches for metal lines.

Figure 1D:
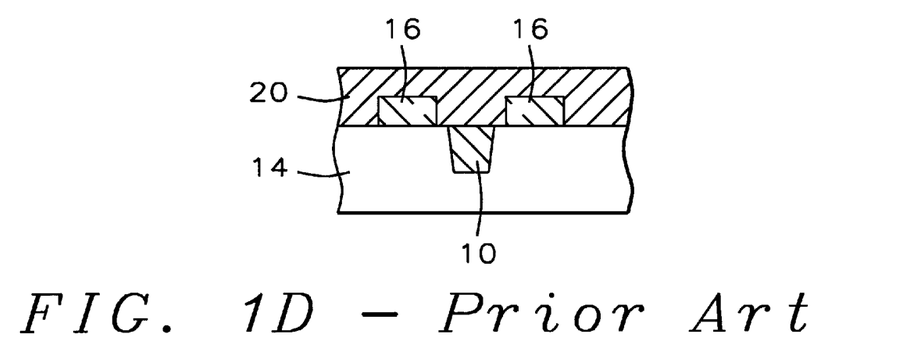

FIG. 1d shows the deposition of metal to fill the trenches.

Figure 1E:
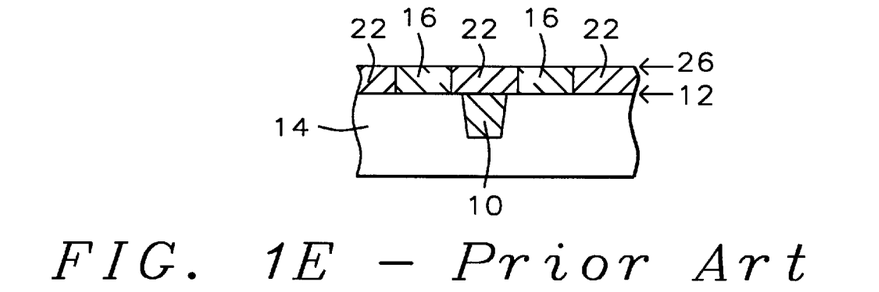

FIG. 1e shows the removal of the excess metal on the surface.

The elements shown in FIGS. 1a though 1e are the following:

- 10 (FIG. 1a) is a damascene plug.
- 14 (FIG. 1a) is a semiconductor layer in the surface of which a damascene plug is created.
- 12(FIG. 1a) is the surface of layer 14 after layer 14 has been polished.
- 16 (FIG. 1b) is a layer of intra metal dielectric that has been deposited over the surface of layer 14.
- 18 (FIG. 1c) are the openings that are created in layer 16 of dielectric for damascene trenches.
- 20 (FIG. 1d) is the layer of conductive material that is deposited over the exposed surface of layer 14, including the surface of the patterned layer 16 of dielectric.
- 22 (FIG. 1e) are the conductive damascene interconnect lines overlying the damascene via 10.
- 26 (FIG. 1e) is the surface of the layer 16 of dielectric and the damascene trenches 22 after the excess conductive material (20, FIG. 1d) has been removed from above the layer 16 of dielectric.

Figure 2A:
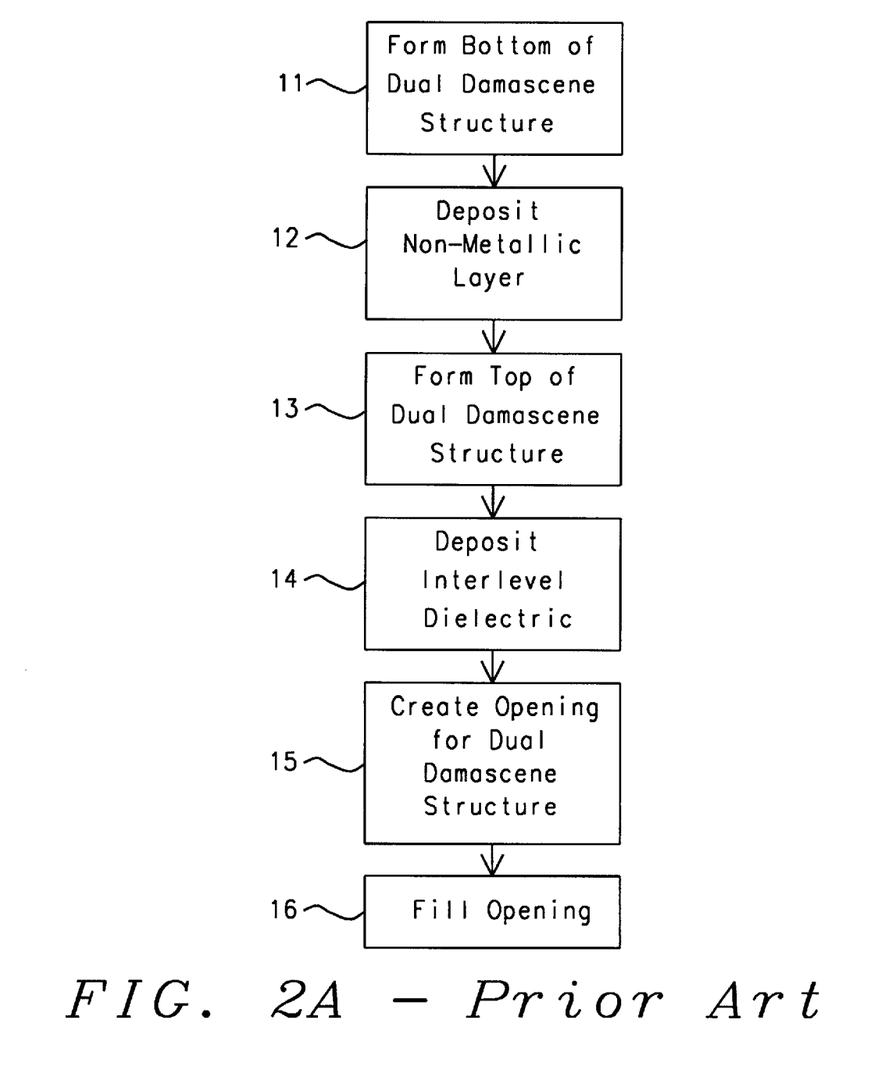
FIGS. 2a and 2b show the Prior Art process of forming a dual damascene structure.
Figure 2B:
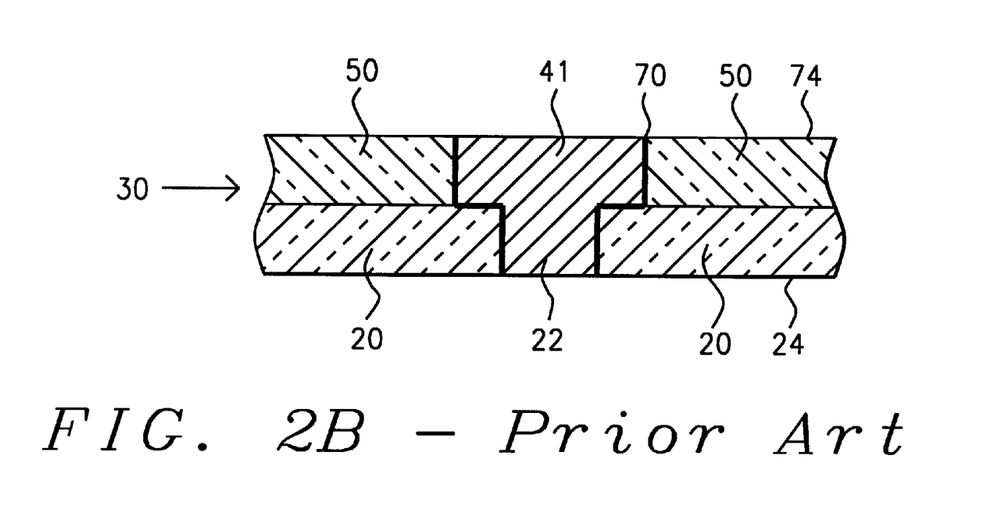

FIG. 2a gives and overview of the sequence of steps required of forming a Prior Art dual Damascene structure. The numbers referred to in the following description of the formation of the dual Damascene structure relate to the cross section of the completed dual Damascene structure that is shown in FIG. 2b.

FIG. 2a, 11 shows the creation of the bottom part of the dual Damascene structure by forming a via pattern 22 on a surface 24, this surface 24 can be a semiconductor wafer but is not limited to such. The via pattern 22 is created in the plane of a dielectric layer 20 and forms the lower part of the dual Damascene structure. $SiO_2$ can be used for this dielectric.

FIG. 2a, 12 shows the deposition within plane 30 (FIG. 2b) of a layer of non-metallic material such as poly-silicon on top of the first dialectric 20 and across the vias 22, filling the via openings 22.

FIG. 2a, 13 shows the formation of the top section 41 of the dual Damascene structure by forming a pattern 41 within the plane of the non-metallic layer 30. This pattern 41 mates with the pattern of the previously formed vias 22 (FIG. 2a, 11) but it will be noted that the cross section of the pattern openings 41 within the plane 30 of the non-metallic layer is considerably larger than the cross section of the via openings 22 (FIG. 2a, 11). After pattern 41 has been created and as part of this pattern creation step, the remainder of the non-metallic layer 30 is removed, the pattern 41 remains at this time.

FIG. 2a, 14 shows the deposition and planarization (down to the top surface of pattern 41) of an inter level dielectric (ILD) 50, a poly-silicon can be used for this dielectric.

FIG. 2a, 15 shows the creation of an opening by removing the poly-silicon from the pattern 41 and the vias 22. It is apparent that this opening now has the shape of a T and that the sidewalls of the opening are not straight but show a top section that is larger than the bottom section.

FIG. 2a, 16 shows the cross section of the dual Damascene structure where a barrier 70 has been formed on the sides of the created opening. The opening, which has previously been created by removing the poly-silicon from the pattern 41 and the vias 22, has been filled with a metal. Metal such as Wolfram or copper can be used for this latter processing step.

U.S. Pat. No. 5,527,739 (Parrillo et al.) teaches a Cu layer with a Cu permeable or refractory metal (e.g. Ti) overlying and a forming gas anneal. However, this reference differs from the invention.

U.S. Pat. No. 5,807,660 (Lin et al.) shows a $N_2O$ plasma treatment for an oxide layer to improve adhesion to photoresist.

U.S. Pat. No. 5,814,557 (Venkatraman et al.) teaches an Al cap over a Cu plug.

U.S. Pat. No. 5,731,245 (Joshi et al. hard cap. shows a Cu plug with a CuGe hard cap.

U.S. Pat. No. 5,612,254 (Mu et al.) shows a Cu interconnect with a SiN layer thereover.

SUMMARY OF THE INVENTION

A principle objective of the invention is to reduce delamination between copper and its surrounding dielectric for the damascene process.

Another objective of the invention is to improve adhesion between copper and its surrounding dielectric for the damascene process.

Another objective of the invention is to reduce the formation of bubbles between copper and its surrounding dielectric for the damascene process.

Yet another objective of the invention is to improve processing yield for the successive deposition of dielectric layers as part of the damascene process.

In accordance with the objectives of the invention a new method is provided to improve surface adhesion between copper surfaces and the dielectric that is deposited over these copper surfaces. The invention eliminates the formation of CuO bubbles and unstable copper surface. A 400 degrees C. pre-heat relaxes the copper surface after polishing of this surface. A $NH_3$ plasma treatment of the surface of the damascene structure removes the CuO bubbles and forms copper grain on the surface of the damascene structure to improve adhesion.

DESCRIPTION OF THE PREFERRED EMBODIMENTS

Figure 3:
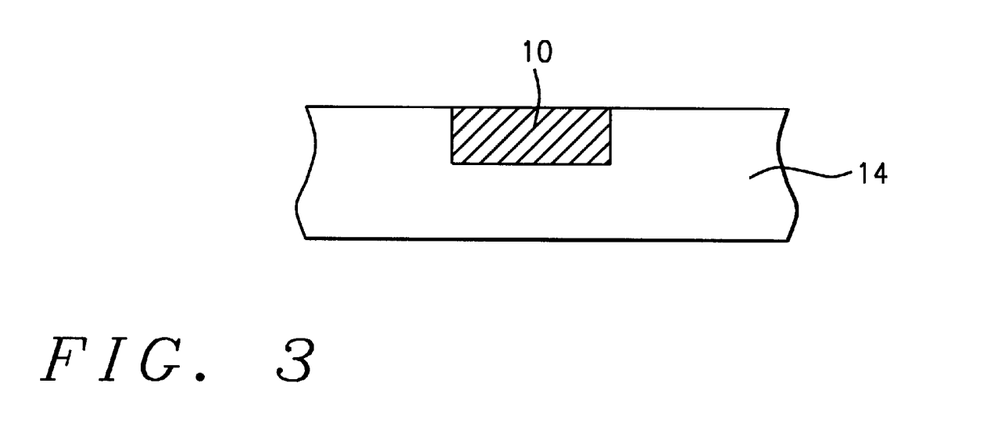
FIG. 3 shows a cross section of a damascene structure that is to be treated in accordance with the invention.

Referring now to FIG. 3, there is shown a cross section of the representative damascene structure 10 created in the surface of a blank semiconductor surface 14 that is to be treated in accordance with the processing steps of the invention. The damascene structure as shown in FIG. 3 is representative of the damascene structures that have previously been explained under FIGS. 1a through 1e (for the damascene process) and FIGS. 2a and 2b (for the dual damascene process).

Figure 4:
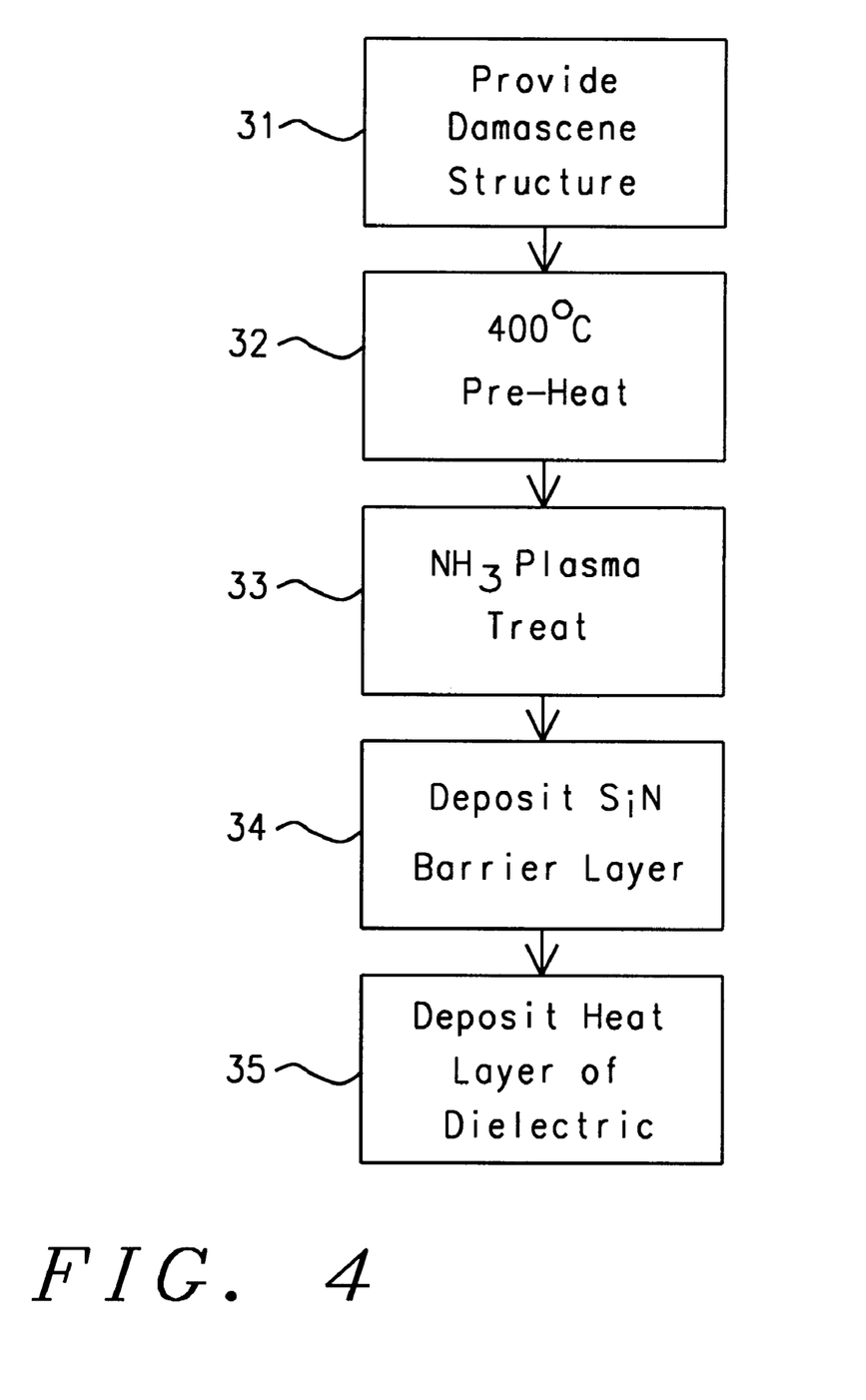
FIG. 4 show the sequence of processing steps required to treat the damascene structure within the scope of the invention.

Referring now to FIG. 4, there is shown the sequence of steps that are required to achieve the objectives of the invention.

FIG. 4, 31 shows the providing of a damascene structure. This structure can be a damascene or a dual damascene structure, both structures have previously been detailed.

FIG. 4, 32 shows the 400 degrees C. pre-heat that is applied to the damascene structure of FIG. 3. This pre-heat can be applied in an atmospheric environment and under atmospheric pressure for a duration of about 1 minute.

The 400 degrees C. pre-heating of the substrate is heating the substrate at a temperature between about 300 and 450 degrees C. in an ambient environment, under atmospheric pressure, for a time of between about 3 seconds and 30 minutes.

In the deposition of layers of dielectric over a damascene structure, the adhesion between the newly deposited layer of dielectric and the underlying layer of copper is of concern. Previous steps of processing that have been used to create the damascene profile include smoothing of the surface of the damascene copper profile, this smoothing leaves a relatively smooth surface area with a molecular structure that does not lend itself to intense affinity between the surface and the layer of dielectric that is deposited over it. It is therefore to the benefit of the process of depositing the next layer of dielectric if the molecular structure of this copper surface is treated such that the granularity of the copper surface increases. This increase in granularity of the surface of the copper layer results in improved adhesion between the copper and the layer of dielectric that is deposited over this surface. The copper surface of the damascene structure may also, due to previous processing steps, not be in a stable (molecular) condition. This further decreases the quality of the contact between the copper surface and the overlying layer of dielectric further decreasing the quality of the adhesion between these two surfaces and leading to delamination of the overlying layer of dielectric. The copper surface is stabilized by a pre-heat that is applied prior to the deposition of the (overlying) layer of dielectric.

FIG. 4, 33 shows the $NH_3$ plasma treatment that is applied to the top surface of the damascene structure thereby including the surface of the surrounding dielectric. During Prior Art creation of the copper damascene structure, CuO bubbles appear at the interface between the copper and the its surrounding dielectric due to the tendency of copper to rapidly oxidize when exposed to ambient air conditions or to an oxidizing environment. The bubbles are most prone to occur at the surface of the interface between the deposited copper and the surrounding dielectric. This results in poor adhesion of the next layer of dielectric overlying the bubbles because the bubbles prevent continuous contact between the (to be deposited or overlying) dielectric and the existing (underlying) surface of the copper and dielectric. The removal of the CuO bubbles will therefore improve the quality of the surface over which the (next) layer of dielectric is deposited by improving the adhesion between the (underlying) existing surface and the (overlying or newly deposited) layer of dielectric. The CuO that causes the occurrence of the bubbles can be reduced by a $NH_3$ plasma treatment of the surface of the damascene structure.

The $NH_3$ plasma treatment is performed at a power of between about 100 and 2000 Watt, a pressure of between about 1 mTORR and 100 TORR, an $NH_3$ flow of between about 10 and 10K SCCM for between about 3 seconds and 30 minutes at a temperature between about 200 and 500 degrees C. FIG. 4, 34 shows the deposition of a SiN diffusion barrier. U.S. Pat. No. 5,874,356 teaches that, when a metallic material such as tungsten or aluminum is used to fill a contact window, the window is typically lined with a thin layer of titanium or titanium/titanium nitride prior to contact window fill. The main purpose of the titanium is to improve contact resistance. The TiN film is deposited to act as a diffusion barrier to certain elements such as silicon from the substrate fluorine generated during the tungsten chemical vapor deposition process. The thin layer of Ti or TiN also acts as a glue layer to improve adhesion to tungsten. The layer may further act as a wetting layer to enhance the reflow of aluminum. The liner of Ti and TiN is typically deposited by a collimated sputtering process or a chemical vapor deposition process. A desirable thickness for the Ti layer is between about 200 angstrom and about 800 Angstrom, while the same for the TiN layer is between about 800 Angstrom and about 2500 Angstrom.

The process of the invention teaches the application of a thin layer of SiN to form a barrier for Cu diffusion, FIG. 4, 34. The above indicated heat treatment of the surface of the damascene structure (after polish of that surface) has, as previously indicated, formed a stable grain structure in the surface of the damascene structure. The adhesion between the deposited SiN and the underlying layer of copper has been experimentally measured. These measurements confirm that the adhesion between the copper surface of the damascene structure and the overlying layer of SiN is improved due to the heat treatment and/or the $NH_3$ plasma treatment. The processing conditions for the application of the thin layer of SiN are as follows: a temperature between about 200 and 500 degrees C., a pressure between about 1 mTORR and 100 TORR, a time between about 2 and 100 seconds, an environment of $SiH_4+NH_3+N_2$ or $Si_2H_6+NH_3+N_2$ or $SiH_4+N_2+Ar$ using a plasma or thermal process.

The barrier layer can also be deposited over the damascene structure by depositing a layer of SiN using PECVD, in a temperature range of between 200 and 500 degrees C., to a thickness of between about 50 and 1000 Angstrom.

The barrier layer can also be deposited over the damascene structure by depositing using r.f. sputtering, in a temperature range of between 700 and 800 degrees C., to a thickness of between about 500 and 1000 Angstrom.

The step of plasma treating the surface of the damascene structure (step 33, FIG. 4) can also be performed prior to the step of pre-heating the substrate (step 32, FIG. 4).

It must be noted at this time that the layer of deposited SiN does not need to be stripped and serves as a layer for the next dual damascene structure. The method that is provided by the invention improves the adhesion between the Cu and the SiN whereby the SiN layer forms the first layer of the next dual damascene structure.

FIG. 4, 35 shows the deposition of the (overlying) layer of dielectric. This dielectric shows improved qualities of adhesion and delamination due to the applied processing steps of the invention.

Figure 5A:
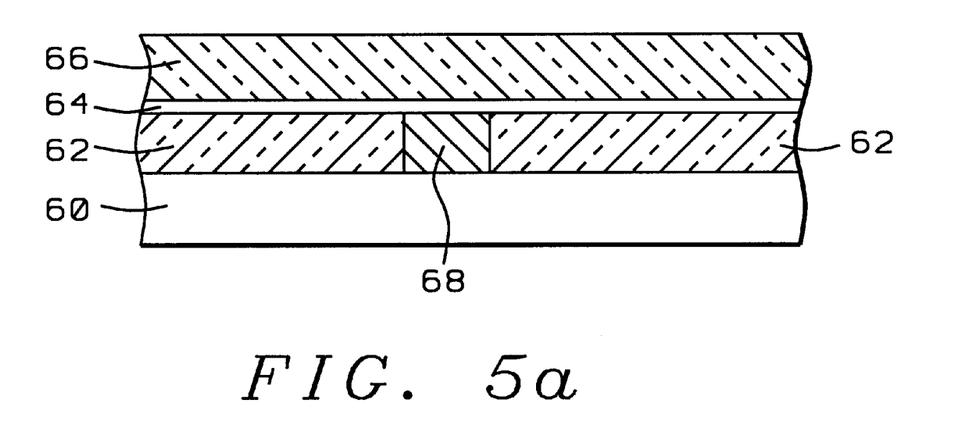
FIG. 5a shows a cross section of a semiconductor substrate that has been provided with a conductive damascene plug embedded in a first layer of dielectric, a barrier layer has been deposited over the first layer of dielectric, a second layer of dielectric has been deposited over the barrier layer.

FIG. 5a shows a cross section of a semiconductor substrate 60 that has been provided with:

- a conductive damascene plug 68 embedded in
- a first layer 62 of dielectric, this first layer 62 of dielectric forms an intra-level dielectric (ILD) of the damascene plug 68
- a barrier layer 64 that has been deposited over the first layer 62 of dielectric
- a second layer 66 of dielectric that has been deposited over the barrier layer 64.

Figure 5B:
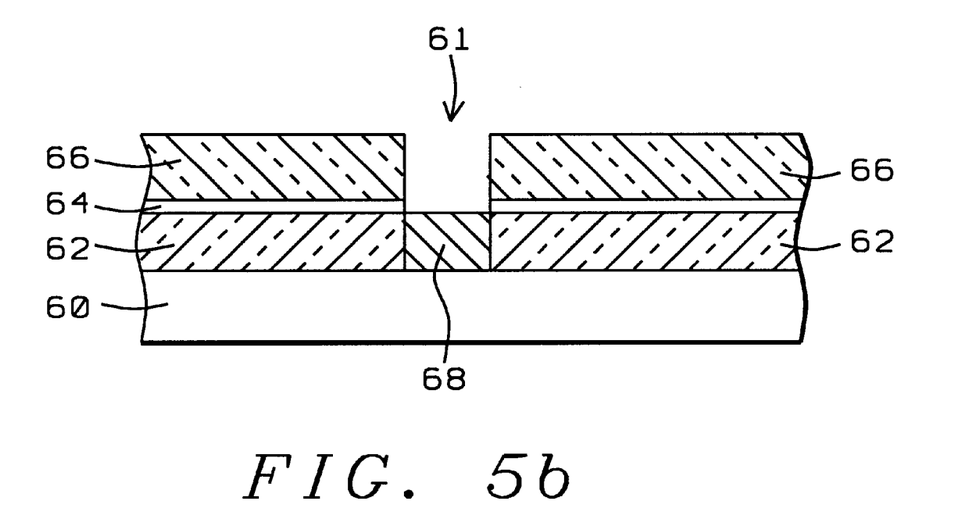
FIG. 5b shows the cross section of FIG. 5a after an opening has been etched through the second layer of dielectric and the barrier layer, exposing the surface of the damascene plug.

FIG. 5b shows the cross section of FIG. 5a after an opening 61 has been etched through the second layer 66 of dielectric and the barrier layer 64, exposing the surface of the damascene plug 68.

The second layer 66 of dielectric can contain silicon oxide, and can be deposited using either LPCVD, PECVD, or APCVD, processing, at a temperature between about 200 to 800 degrees C. to a thickness between about 1000 to 10000 Angstrom.

Etching of the second layer 66 of dielectric is anisotropic, RIE processing, using $CHF_3$ as an etchant, with the via opening 61 having an opening between about 0.3 to 0.5 um. in diameter, resulting in an aspect ratio of between about 1 to 3.

From the foregoing it will be clear that, although a specific embodiment of the present invention has been described herein for purposes of illustration, various modifications to the present invention may be made without deviating from the spirit and scope of the present invention. Accordingly, the present invention is not limited except as by the appended claims.

What is claimed is:

1. A method of improving adhesion between a surface of a copper damascene structure and an overlying layer of dielectric by eliminating an unstable copper surface, comprising the steps of:

providing a semiconductor substrate with a copper damascene structure created on the surface of said substrate, said damascene structure being surrounded by a layer of intra-level dielectric (ILD);

pre-heating said substrate, including said damascene structure, further including said layer of ILD, said pre-heating said substrate comprising heating said substrate at a temperature between about 300 and 450 degrees C., in an ambient environment, under atmospheric pressure, for a time of between about 3 seconds and 30 minutes;

depositing a barrier layer over said pre-heated damascene structure, including said layer of ILD;

depositing said overlying layer of dielectric over the surface of said barrier layer; and etching said overlying layer of dielectric and said barrier layer in a pattern, creating via openings to said damascene structure created on the surface of said substrate.

2. The method of claim 1 wherein said depositing a barrier layer over said damascene structure is depositing a layer of SiN using PECVD in a temperature range of between 200 and 500 degrees C. to a thickness of between about 50 and 1000 Angstrom.

3. The method of claim 1 wherein said depositing a barrier layer over said damascene structure is depositing a layer of SiN under a temperature between about 200 and 500 degrees C., a pressure between about 1 mTORR and 100 TORR, a time between about 2 and 100 seconds, an environment of $SiH_4+NH_3+N_2$ or $Si_2H_6+NH_3+N_2$ or $SiH_4+N_2+Ar$ using a plasma or thermal process.

4. The method of claim 1, wherein said overlying layer of dielectric is silicon oxide, deposited using either LPCVD, PECVD, or APCVD processing, at a temperature between about 200 to 800 degrees C. to a thickness between about 1000 to 10000 Angstrom.

5. The method of claim 1, wherein said etching said overlying layer of dielectric and said barrier layer is anisotropic, RIE processing, using $CHF_3$ as an etchant, with said via openings having an opening between about 0.3 to 0.5 um. in diameter, resulting in an aspect ratio of between about 1 to 3.

6. A method of improving adhesion between the surface of a copper damascene structure and an overlying layer of dielectric by eliminating the formation of CuO bubbles, comprising the steps of:

providing a semiconductor substrate with a copper damascene or dual damascene structure created on the surface of said substrate, said damascene structure being surrounded by a layer of intra-level dielectric (ILD);

plasma treating the surface of said damascene structure, including said layer of ILD, said plasma treating the surface of said substrate comprising heating said substrate at a temperature between about 300 and 450 degrees C. in an $NH_3$ environment with a flow rate of between about 10 and 10K sccm, under atmospheric pressure, for a time of between about 3 seconds and 30 minutes;

depositing a barrier layer over said plasma treated damascene structure, including said layer of ILD;

depositing said overlying layer of dielectric over the surface of said barrier layer; and etching said overlying layer of dielectric and said barrier layer in a pattern, creating via openings to said damascene structure created on the surface of said substrate.

7. The method of claim 6 wherein said depositing a barrier layer over said damascene structure is depositing a layer of SiN using PECVD in a temperature range of between 200 and 800 degrees C. to a thickness of between about 50 and 1000 Angstrom.

8. The method of claim 6 wherein said depositing a barrier layer over said damascene structure is depositing a layer of SiN under a temperature between about 200 and 500 degrees C., a pressure between about 1 mTORR and 100 TORR, a time between about 2 an 100 seconds, an environment of $SiH_4+NH_3+N_2$ or $Si_2H_6+NH_3+N_2$ or $SiH_4+N_2+Ar$ using a plasma or thermal process.

9. The method of claim 6 wherein said overlying layer of dielectric is silicon oxide, deposited using either LPCVD, PECVD, or APCVD processing, at a temperature between about 400 to 800 degrees C. to a thickness between about 1000 to 10000 Angstrom.

10. The method of claim 6 wherein said etching said overlying layer of dielectric and said barrier layer is anisotropic, RIE processing, using $CHF_3$ as an etchant, with said via openings having an opening between about 0.3 to 0.5 um, in diameter, resulting in an aspect ratio of between about 1 to 3.

11. A method of improving adhesion between the surface of a copper damascene structure and an overlying layer of dielectric by eliminating the formation of CuO bubbles and unstable copper surfaces, comprising the steps of:

providing a semiconductor substrate with a copper damascene or dual damascene structure created on the surface of said substrate, said damascene structure being surrounded by a layer of intra-level dielectric (ILD);

pre-heating said substrate, including said damascene structure, further including said layer of ILD, said pre-heating said substrate comprising heating said substrate at a temperature between about 300 and 450 degrees C. in an ambient environment, under atmospheric pressure, for a time of between about 3 seconds and 30 minutes;

plasma treating the surface of said damascene structure, including said layer of ILD, said plasma treating the surface of said substrate being performed at a power of between about 100 and 200 Watt, a pressure of between about 1 mTORR and 100 TORR, an $NH_3$ flow of between about 10 and 10K SCCM for between about 3 seconds and 30 minutes, heating said substrate at a temperature between about 200 and 500 degrees C.;

depositing a barrier layer over said pre-heated and plasma treated damascene structure, including said layer of ILD;

depositing said overlying layer of dielectric over the surface of said barrier layer; and etching said overlying layer of dielectric and said barrier layer in a pattern, creating via openings to said damascene structure created on the surface of said substrate.

12. The method of claim 11 wherein said depositing a barrier layer over said damascene structure is depositing a layer of SiN using r.f. sputtering in a temperature range of between 700 and 800 degrees C. to a thickness of between about 500 and 1000 Angstrom.

13. The method of claim 11 wherein said depositing a barrier layer over said damascene structure is depositing a layer of SiN under a temperature between about 200 and 500 degrees C., a pressure between about 1 mTORR and 100 TORR, a time between about 2 and 100 seconds, an environment of $SiH_4+NH_3+N_2$ or $Si_2H_6+N_3+N_2$ or $SiH_4+N_2+Ar$ using a plasma or thermal process.

14. The method of claim 11 wherein said overlying layer of dielectric is silicon oxide, deposited using either LPCVD, PECVD, or APCVD processing, at a temperature between about 400 to 800 degrees C. to a thickness between about 5000 to 10000 Angstrom.

15. The method of claim 11 wherein said etching said overlying layer of dielectric and said barrier layer is anisotropic, RIE processing, using $CHF_3$ as an etchant, with said via openings having an opening between about 0.3 to 0.5 um, in diameter, resulting in an aspect ratio of between about 1 to 3.

16. The method of claim 11 whereby said plasma treating the surface of said damascene structure is performed prior to said pre-heating said substrate.

* * * * *